US009872096B2

(12) United States Patent
Akino

(10) Patent No.: US 9,872,096 B2
(45) Date of Patent: Jan. 16, 2018

(54) BOUNDARY MICROPHONE

(71) Applicant: Hiroshi Akino, Kanagawa (JP)

(72) Inventor: Hiroshi Akino, Kanagawa (JP)

(73) Assignee: Kabushiki Kaisha Audio-Technica, Tokyo (JP)

( * ) Notice: Subject to any disclaimer, the term of this patent is extended or adjusted under 35 U.S.C. 154(b) by 72 days.

(21) Appl. No.: 15/078,365

(22) Filed: Mar. 23, 2016

(65) Prior Publication Data

US 2016/0286293 A1 Sep. 29, 2016

(30) Foreign Application Priority Data

Mar. 26, 2015 (JP) ................................ 2015-063829

(51) Int. Cl.
*H03G 11/00* (2006.01)
*H04R 1/04* (2006.01)
*H04R 29/00* (2006.01)

(52) U.S. Cl.
CPC ............. *H04R 1/04* (2013.01); *H04R 29/004* (2013.01)

(58) Field of Classification Search
CPC ................................ H04R 1/04; H04R 29/004
See application file for complete search history.

(56) References Cited

U.S. PATENT DOCUMENTS 4,382,159 A * 5/1983 Bowditch ................ H04R 3/00 379/422
8,724,020 B1 * 5/2014 Haddad ................ H04N 5/2254 348/375
8,731,186 B1 * 5/2014 Haddad .................... H04R 3/00 379/421
2003/0163278 A1 * 8/2003 Clark ..................... A63B 57/00 702/138
2005/0031150 A1 * 2/2005 Collins .................... H04R 1/38 381/355
2010/0287799 A1 * 11/2010 Clegg .................. B42D 15/022 40/124.02
2011/0293117 A1 * 12/2011 Yoshino ................. H04R 1/083 381/123
2012/0027239 A1 * 2/2012 Akino ...................... H04R 1/28 381/345
2013/0108074 A1 * 5/2013 Reining ................. H04R 3/005 381/92
2014/0053651 A1 * 2/2014 Besling ................. G01L 9/0042 73/702
2014/0053713 A1 * 2/2014 Truchsess .............. G10D 13/06 84/723

(Continued)

FOREIGN PATENT DOCUMENTS

JP 5534822 B2 7/2014

*Primary Examiner* — Simon King
(74) *Attorney, Agent, or Firm* — Whitham, Curtis & Cook, P.C.

(57) ABSTRACT

A boundary microphone is provided that does not generate spark discharge during an operation of a switch. The boundary microphone includes a microphone unit 6, and a switching unit (a button 4, a tube 9, a detector 10, a comparator, and a switching circuit) that switches turning-on or turning-off of output signals from the microphone unit 6, wherein the switching unit (the button 4, the tube 9, the detector 10, the comparator, and the switching circuit) includes an air chamber 9 and a controller that controls the turning-on or turning-off based on the air pressure inside the air chamber 9.

9 Claims, 3 Drawing Sheets

(56) References Cited

U.S. PATENT DOCUMENTS

| | | | | |
|---|---|---|---|---|
| 2015/0041930 A1* | 2/2015 | Kim | H04R 19/005 | |
| | | | 257/416 | |
| 2015/0141774 A1* | 5/2015 | Ogawa | A61C 17/22 | |
| | | | 600/301 | |
| 2015/0146906 A1* | 5/2015 | Je | H04R 7/02 | |
| | | | 381/369 | |
| 2015/0158722 A1* | 6/2015 | Lim | B81B 7/02 | |
| | | | 257/416 | |
| 2015/0282527 A1* | 10/2015 | Henry, Jr. | A24F 47/008 | |
| | | | 131/328 | |
| 2016/0273986 A1* | 9/2016 | Neubarth | G01L 9/0072 | |

* cited by examiner

BOUNDARY MICROPHONE

TECHNICAL FIELD

The present invention relates to a boundary microphone.

BACKGROUND ART

Some microphones used in meetings are boundary microphones that are placed on desktops for sound collection. Some boundary microphones have a function that allow speakers to operate the switches of the microphones. Such an operation of a switch generates sound and vibration in the boundary microphone. The sound and vibration are transmitted to a microphone unit inside the boundary microphone. As a result, the microphone unit generates noise. Various boundary microphones including membrane switches for preventing such noise have been proposed (for example, refer to Japanese Patent Publication No. 5534822).

FIG. 4 is a cross-sectional side view illustrating a conventional boundary microphone.

The boundary microphone includes a base 2*a*, a cover 3*a*, a button 4*a*, a circuit board 5*a*, a microphone unit 6*a*, a cord bush 7*a*, a microphone cable 8*a*, a threaded screw T1, and a threaded screw T2. The boundary microphone is placed on a mounting surface G, such as a desktop.

The base 2*a* is composed of metal. The base 2*a* has a flat shape with an exposed upper face (the upper side in FIG. 4). The base 2*a* has a depression and a cavity 9*a*. The depression is disposed in the upper face of the base 2*a*. The cavity 9*a* is provided between the depression and the exposed portion of the upper face of the base 2*a* (hereinafter referred to as "exposed portion").

The cover 3*a* covers the exposed portion of the upper face of the base 2*a*. The cover 3*a* is composed of metal. The cover 3*a* has multiple acoustic-wave entering holes. The cover 3*a* is fixed to the base 2*a* with the threaded screw T1.

The button 4*a* is supported in the depression in the base 2*a* with a support composed of an elastic material, such as rubber. When the button 4*a* is pressed by a finger F of an operator, then the button 4*a* depresses into the depression in the base 2*a*. When the button 4*a* is released from the pressing by the finger F of the operator, then the button 4*a* returns to the position prior to the pressing.

The base 2*a* and the cover 3*a* define a space inside the boundary microphone. The circuit board 5*a* and the microphone unit 6*a* are accommodated in this space.

The circuit board 5*a* is fixed to the base 2*a* with the threaded screw T2. The circuit board 5*a* is electrically connected to one end of the microphone cable 8*a*. The other end of the microphone cable 8*a* is led out from the base 2*a* through the cord bush 7*a*.

The circuit board 5*a* is provided with various electric circuits that process electrical signals output from the microphone unit 6*a* to generate audio signals. The audio signals generated by the circuit board 5*a* are output to external processors for audio signals via the microphone cable 8*a*.

The microphone unit 6*a* is, for example, a condenser microphone unit. The microphone unit 6*a* includes a diaphragm and a fixed electrode, which constitute a condenser. The diaphragm receives acoustic waves passing through the acoustic-wave entering hole in the cover 3*a* and vibrates. The microphone unit 6*a* converts the variation in the capacitance between the diaphragm and the fixed electrode, which constitute a condenser, to electrical signals and outputs these electrical signals. The microphone unit 6*a* is electrically connected to the circuit board 5*a*.

The cord bush 7*a* is disposed on the base 2*a*. The position of the cord bush 7*a* on the base 2*a* (at the right in FIG. 4) is opposite to the position of the button 4*a*. The microphone cable 8*a* passes through the cord bush 7*a*.

The button 4*a* is, for example, a part of a pressure-sensitive switch. The pressure-sensitive switch includes a membrane and a circuit board. The circuit board includes a flexible printed board L, which is indicated by the dashed line in FIG. 4. The membrane and the circuit board of the pressure-sensitive switch are attached to the base 2*a* such that the patterned portion of the circuit board faces the membrane. The pressure-sensitive switch turns on due to contact of the pattern of the circuit board and the membrane.

The flexible printed board L passes through the cavity 9*a*. The flexible printed board L is electrically connected to the circuit board 5*a*. As a result, the pressing operation of the button 4*a* is transmitted to the circuit board 5*a* via the flexible printed board L.

SUMMARY OF INVENTION

Technical Problem

Spark discharge generated due to an electrically charged human body approaching or contacting a switch of a boundary microphone causes the generation of noise during the operation of the switch. Such spark discharge conforming to Paschen's Law is generated between the electrically charged human body and the conductor that constitutes the switch. The spark discharge is prevented by covering the switch with an insulating film.

Unfortunately, an insulating layer is damaged by high discharge quantity from the human body. This results in the generation of the spark discharge. The discharge current generated by the spark discharge flows through the conductor (flexible printed board L) and to the inside of the boundary microphone and generates noise at the microphone unit 6*a*. Thus, it is preferred that the conductor leading into the boundary microphone be absent from the pressure-sensitive switch.

An object of the present invention, which has been made to solve the problem described above, is to provide a boundary microphone without generation of spark discharge during an operation of a switch.

Solution to Problem

The boundary microphone of the present invention includes a microphone unit and a switching unit that switches turning-on or turning-off of signals output from the microphone unit, wherein the switching unit includes an air chamber and a controller that controls the turning-on or turning-off based on the air pressure in the air chamber.

The boundary microphone of the present invention does not generate spark discharge during an operation of a switch.

DESCRIPTION OF EMBODIMENTS

Embodiments of a boundary microphone according to the present invention will now be described with reference to the attached drawings.

Figure 1:
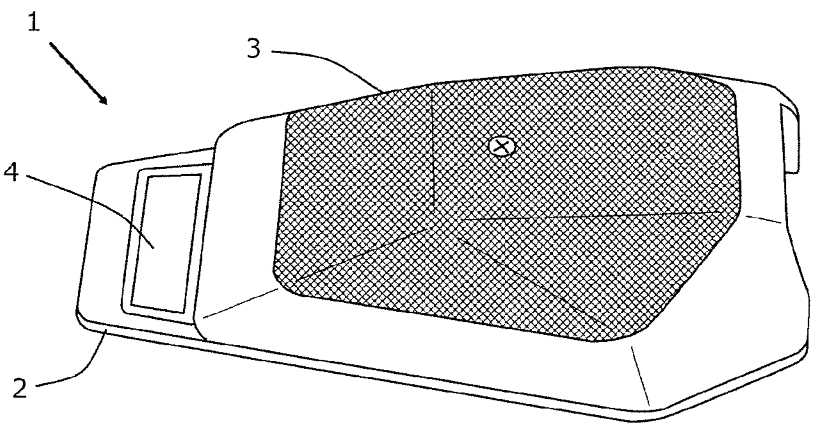
FIG. 1 is an external view illustrating a boundary microphone according to an embodiment of the present invention.

FIG. 1 is an external view illustrating a boundary microphone according to an embodiment of the present invention.

Figure 2:
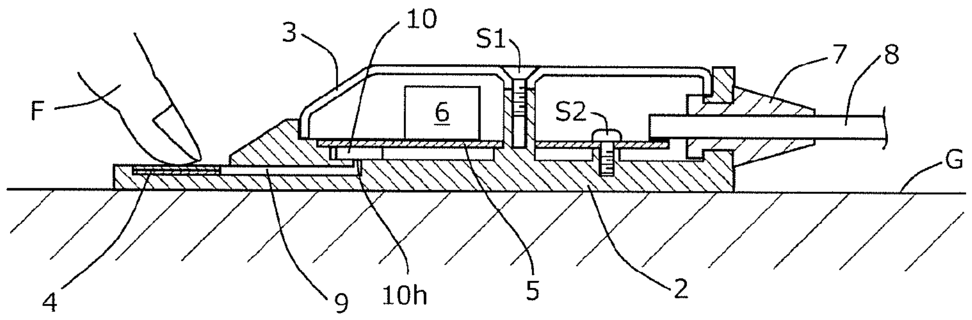
FIG. 2 is a cross-sectional side view illustrating the boundary microphone in FIG. 1.

FIG. 2 is a cross-sectional side view illustrating the boundary microphone in FIG. 1.

A boundary microphone 1 includes a base 2, a cover 3, a button 4, a circuit board 5, a microphone unit 6, a cord bush 7, a microphone cable 8, a detector 10, a threaded screw S1, and a threaded screw S2. The boundary microphone 1 is placed on a mounting surface G, such as a desktop.

The base 2 is composed of metal. The base 2 has a flat shape with an exposed upper face (at the upper side in FIG. 2). The base 2 has a depression and a communication hole (see, e.g., hollow tube 9). The depression is disposed on the upper face near the front edge of the base 2 (on the left in FIG. 2). The communication hole is provided between the depression and the exposed portion of the upper face of the base 2 (hereinafter referred to as "exposed portion") along the planar direction (the horizontal direction in FIG. 2). The communication hole allows communication between the depression and the exposed portion.

The base 2 may be cast, such as zinc die-cast. Alternatively, the base 2 may be a pressed part of another metal.

The cover 3 covers the exposed portion of the base 2. The cover 3 is composed of metal. The cover 3 has multiple acoustic-wave entering holes. The cover 3 is fixed to the base 2 with the threaded screw S1.

The cover 3 may be a punched plate (perforated plate), which is a metal plate, such as an iron plate, having many holes. Alternatively, the cover 3 may be a metal mesh.

Figure 3:
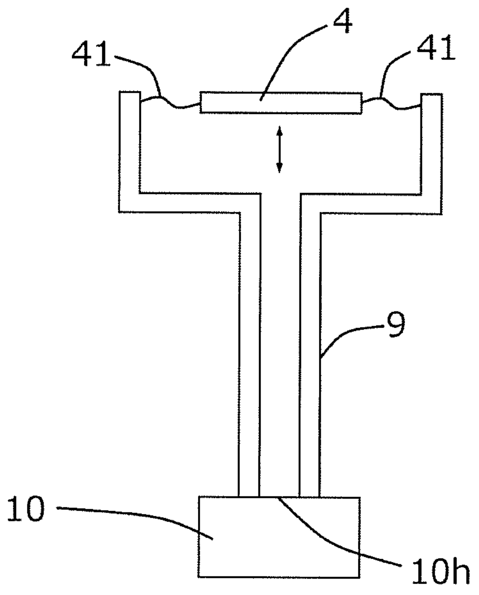
FIG. 3 is a schematic view illustrating a part of the structure of a switching unit provided in the boundary microphone in FIG. 1.
Figure 4:
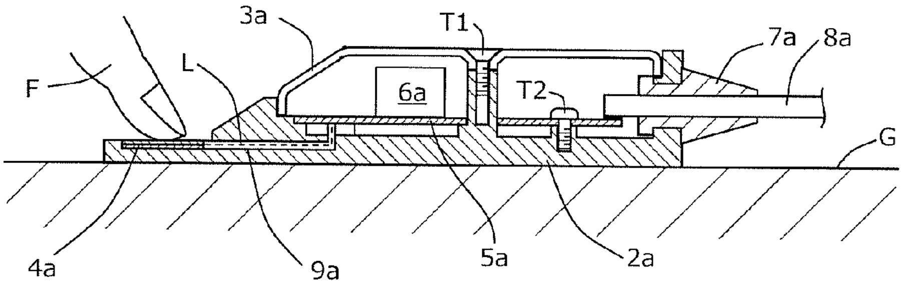
RELATED ART FIG. 4
FIG. 4 is a cross-sectional side view illustrating a conventional boundary microphone.

The button 4 includes a support 41 (see FIG. 3). The support 41 is composed of an elastic material, such as rubber. The button 4 is supported in the depression of the base 2 with the support 41. When the button 4 is pressed by a finger F of an operator, then the button 4 depresses into the depression in the base 2. When the button 4 is released from pressing by the finger F of the operator, then the button 4 returns to the position prior to the pressing.

The base 2 and the cover 3 define a space inside the boundary microphone 1. The circuit board 5 and the microphone unit 6 are placed in this space.

The circuit board 5 is fixed to the base 2 with the threaded screw S2. The circuit board 5 is electrically connected to one end of the microphone cable 8. The other end of the microphone cable 8 is led out from the base 2 through the cord bush 7.

The circuit board 5 has various electric circuits that process electrical signals output from the microphone unit 6, which is described below, to generate audio signals. The audio signals generated by the circuit board 5 are output to external processors for audio signals via the microphone cable 8.

The microphone unit 6 is, for example, a condenser microphone unit. The microphone unit 6 includes a diaphragm and a fixed electrode, which constitute a condenser. The diaphragm receives acoustic waves passing through the acoustic-wave entering holes in the cover 3 and vibrates. The microphone unit 6 converts the variation in the capacitance between the diaphragm and the fixed electrode, which constitute the condenser, to an electrical signal and outputs the electrical signal. The microphone unit 6 is electrically connected to the circuit board 5.

The microphone unit 6 may be placed in the space inside the boundary microphone 1 with the microphone unit 6 mounted on the circuit board 5. Alternatively, the microphone unit 6 may be placed in the space separately from the circuit board 5.

The cord bush 7 is disposed on the base 2. The position of the cord bush 7 on the base 2 (at the right in FIG. 2) is opposite to the position of the button 4. The microphone cable 8 passes through the cord bush 7.

The detector 10 is attached to the base 2 in the space in the boundary microphone 1 in which the circuit board 5 and the microphone unit 6 are placed. The detector 10 is disposed on the base 2 at an end of the communication hole adjacent to the exposed portion.

The button 4, the communication hole in the base 2, the detector 10, a comparator (not shown), and a switching circuit (not shown) constitute a switching unit. That is, the boundary microphone 1 includes the switching unit. The switching unit switches turning-on or turning-off the signals output from the microphone unit 6.

FIG. 3 is a schematic view illustrating a part of the structure of the switching unit of the boundary microphone 1.

As described above, the button 4 is attached near the edge of the base 2. The button 4 and the microphone unit 6 are attached to the base 2 and are remote from each other. The button 4 functions as an operating unit of the switching unit. The button 4 is supported movably (e.g., movable in the vertical direction in FIG. 3) within the depression of the base 2 with the support 41. The operation of the button 4 includes a manual operation, such as a pushing operation with a finger F of the operator, for example.

The communication hole in the base 2 constitutes a hollow tube 9 that connects the button 4 (operating unit) and the detector 10.

The button 4 is disposed at one end of the tube 9. The detector 10 is disposed at the other end of the tube 9. The tube 9 defines an air chamber having two ends closed by the button 4 and the detector 10. The air pressure in the tube 9 varies through the pressing operation of the button 4. In other words, the button 4 varies the air pressure in the tube 9.

The comparator and the switching circuit function as a controller. The controller controls the turning-on or turning-off of the signals output from the microphone unit 6 based on the air pressure in the tube 9 that varies in response to the pressing operation of the button 4. The comparator and the switching circuit, which serve as the controller, are mounted on the circuit board 5.

The controller controls whether to output the audio signals generated by the circuit board 5 to the microphone cable 8 or not. That is, for example, the controller outputs audio signals generated by the circuit board 5 to the microphone cable 8 during pressing of the button 4. The controller does not output audio signals generated by the circuit board 5 to the microphone cable 8 during unpressing of the button 4.

The controller may be configured to start or stop the output of the audio signals generated by the circuit board 5 to the microphone cable 8 every time the button 4 is pressed.

The detector 10 detects the air pressure in the tube 9 or the variation in the air pressure in the tube 9 and outputs the detected result to the controller. That is, the detector 10 detects the absolute value of the air pressure in the tube 9. In other words, the detector 10 detects the variation in the air pressure (per unit time) in the tube 9.

The detector 10 includes, for example, a condenser microphone unit (hereinafter referred to as "detecting unit") other than the microphone unit 6. The detector (detecting unit) 10 includes a unit case having an open end and a closed end, and a diaphragm and a fixed electrode, which constitute a condenser. The diaphragm is a thin film composed of synthetic resin with a metal (preferably gold) film deposited on one side. The diaphragm has a disk shape. The fixed electrode is composed of metal. The fixed electrode has a disk shape. At least one of the faces of the fixed electrode, for example, the face adjacent to the diaphragm, has an electret plate bonded thereto. The fixed electrode and the electret plate constitute an electret board. The diaphragm and the fixed electrode are placed in the unit case. The unit case, the diaphragm, and the fixed electrode constitute the condenser microphone unit as detecting unit 10.

The detecting unit 10 has a sound hole 10*h*. The sound hole 10*h* is formed in the bottom face of the unit case of the detecting unit 10. The sound hole 10*h* is aligned with one end of the tube 9. The tube 9 and the detecting unit 10 are disposed on the base 2. The diaphragm vibrates by the pressure of the air passing the sound hole 10*h*. That is, the diaphragm vibrates in response to the pressure of the air in the tube 9 or air chamber. In other words, the capacitance of the condenser including the diaphragm and the fixed electrode of the detecting unit 10 varies in response to the variation in the air pressure in the tube 9. The detecting unit 10 generates an electrical signal corresponding to the air pressure in the tube 9 and outputs the electrical signal to a comparator.

A hole may be provided in a portion of the tube 9 such that the diaphragm of the detecting unit 10 returns to the position prior to the pressing of the button 4 with a lapse of time, even during continuous pressing of the button 4.

The comparator compares the electrical signal output from the detecting unit 10 and a threshold signal preliminary set in the comparator. If the electrical signal output from the detecting unit 10 is more intense than the threshold signal, that is, if the air pressure in the tube 9 exceeds a predetermined pressure due to the pressing of the button 4, the comparator generates a control signal and outputs the control signal to the switching circuit. The control signal will be described below.

The switching circuit includes a switch. The switching circuit opens or closes the switch upon reception of a control signal from the comparator. That is, the opening or closing of the switch is controlled by the controller. The control signal is the signal that instructs the closing or opening of the switch to the switching circuit. When the switch is closed, the audio signals generated by the circuit board 5 are output to the microphone cable 8. When the switch is opened, the audio signals generated by the circuit board 5 are not output to the microphone cable 8.

As described above, the switch is closed upon the air pressure in the tube 9 exceeding a predetermined pressure due to the pressing of the button 4. As a result, the audio signals generated by the circuit board 5 are output to the microphone cable 8. In contrast, the switch is opened upon the air pressure in the tube 9 falling below a predetermined pressure due to the unpressing of the button 4. As a result, the audio signals generated by the circuit board 5 are not output to the microphone cable 8.

The controller may control the opening or closing of the switch in response to the variation in the air pressure in the tube 9. In such a case, the opening or closing of the switch is controlled in response to the speed of the pressing or releasing operation of the button 4.

In the boundary microphone 1 according to the embodiment described above, the pressing operation of the button 4 can be detected through the variation in the air pressure in the tube 9. That is, the conductor leading into the boundary microphone 1 is not provided in the switching unit of the boundary microphone 1. Thus, spark discharge does not occur during an operation of the switch. As a result, the boundary microphone 1 prevents noise due to spark discharge flowing into the boundary microphone 1.

Malfunctions of the switching unit due to audio signals are prevented by an appropriate design of the inner circumference and the length of the tube 9. For example, the frequencies transmitted to the detecting unit 10 are limited to those lower than or equal to the frequencies of the audio signals through an inner diameter of the tube 9 of 2 mm or less and a length of the tube 9 of 20 mm or more. As a result, malfunction of the switching unit due to audio signals can be prevented.

The invention claimed is:

1. A boundary microphone comprising:
a first microphone unit;
a switching unit that switches turning-on or turning-off of output signals from the first microphone unit, and
a detector comprising a second microphone unit,
wherein the switching unit comprises:
an air chamber;
a controller that controls the turning-on or turning-off based on an air pressure in the air chamber; and
an operating unit that varies the air pressure in the air chamber in response to a pressing operation of the operating unit, wherein
the second microphone unit comprises a diaphragm that vibrates in response to the air pressure and a fixed electrode that constitutes a condenser together with the diaphragm, and
the detector detects the air pressure based on a variation in the capacitance between the diaphragm and the fixed electrode.

2. The boundary microphone according to claim 1, wherein
the controller controls the turning-on or turning-off based on output signals from the second microphone unit.

3. The boundary microphone according to claim 1, wherein the pressing operation is a manual operation.

4. The boundary microphone according to claim 1, wherein
the air chamber comprises a hollow tube connecting the operating unit and the detector,
the operating unit is disposed at one end of the tube, and
the detector is disposed at the other end of the tube.

5. The boundary microphone according to claim 4, further comprising:
a base that accommodates the microphone unit, wherein
the switching unit is attached to the base and is remote from the microphone unit, and
the tube is a communication hole provided in the base.

6. The boundary microphone according to claim 5, wherein the hole is provided in a portion of the tube.

7. The boundary microphone according to claim 5, wherein
the base has a face placed on a mounting surface, and
the operating unit, the communication hole and the microphone unit are disposed along a planar direction of the face.

8. The boundary microphone according to claim 5, wherein the base has a depression in communication with the communication hole, and the operating unit comprises a button and a support supporting the button relative to the depression.

9. The boundary microphone according to claim 8, wherein the air chamber comprises the depression and the communication hole.

* * * * *